United States Patent [19]

Parthasarathi et al.

[11] Patent Number: 4,647,315
[45] Date of Patent: Mar. 3, 1987

[54] COPPER STAINPROOFING TECHNIQUE

[75] Inventors: Arvind Parthasarathi, Hamden; Ned W. Polan, Madison, both of Conn.

[73] Assignee: Olin Corporation, New Haven, Conn.

[21] Appl. No.: 750,573

[22] Filed: Jul. 1, 1985

[51] Int. Cl.$^4$ ............................................. C23C 22/33
[52] U.S. Cl. .................................................. 148/6.16
[58] Field of Search ........................................ 148/6.16

[56] References Cited

U.S. PATENT DOCUMENTS

| | | |
|---|---|---|
| 2,030,601 | 2/1936 | McDonald . |
| 2,306,143 | 12/1942 | Stevenson ........................ 148/6.16 |
| 2,412,543 | 10/1946 | Tanner . |
| 2,418,608 | 4/1947 | Thompson et al. . |
| 2,647,865 | 8/1953 | Freud . |
| 3,625,844 | 12/1971 | McKean . |
| 3,677,828 | 7/1972 | Caule . |
| 3,716,427 | 2/1973 | Caule . |
| 3,764,400 | 10/1973 | Caule . |
| 3,853,716 | 12/1974 | Yates et al. . |
| 4,131,517 | 12/1978 | Mitsuo et al. . |
| 4,387,006 | 1/1983 | Kajiwara et al. . |
| 4,432,846 | 2/1984 | Honeycutt, III . |
| 4,468,293 | 8/1984 | Polan et al. . |
| 4,515,671 | 5/1985 | Polan et al. . |

FOREIGN PATENT DOCUMENTS 2030176A 4/1980 United Kingdom .
2073779A 10/1981 United Kingdom .

*Primary Examiner*—Sam Silverberg
*Attorney, Agent, or Firm*—Barry L. Kelmachter; Howard M. Cohn; Paul Weinstein

[57] ABSTRACT

The present invention relates to a technique for improving the tarnish and oxidation resistance of copper and copper base alloy materials. The technique of the present invention involves immersing the copper or copper base alloy material in a dilute aqueous chromic acid-phosphoric acid solution. After emerging from the chromic acid-phosphoric acid solution, the copper or copper base alloy material is preferably rinsed with a dilute aqueous caustic solution and dried. Copper and copper base alloy materials treated in accordance with the present invention have particular utility in printed circuit applications.

20 Claims, No Drawings

COPPER STAINPROOFING TECHNIQUE

The present invention broadly relates to treating copper and copper base alloy materials to form a tarnish and oxidation resistant film thereon.

One of the problems which faces manufacturers of both electrolytic and wrought copper and copper alloy materials is the staining of the materials during storage and shipment. This staining generally results from the exposure of the copper to normal atmospheric conditions. These stains are aesthetically unpleasant as well as a potential source of serious problems during the manufacture of many products such as printed circuits. For example, staining of copper foil prior to its lamination to a dielectric substrate can affect both the bond strength between the foil and the substrate material and the etching characteristics of the resultant laminate.

In the past, stain resistance has been imparted to copper and copper base alloy materials by immersion of the copper material in an electrolyte containing chromate ions. U.S. Pat. No. 3,625,844 to McKean describes a method of stainproofing copper foil involving the electrolytic treatment of copper foil in an aqueous electrolyte under critical conditions of hexavalent chromium ion concentration, cathode current density, and treatment time. U.S. Pat. No. 3,853,716 to Yates et al. discusses the McKean process and points out that it is not a completely satisfactory stainproofing technique because a build-up of copper and chromium cations in the electrolyte bath interfere with the effectiveness of the stainproofing. Yates et al. attempt to overcome this problem by rendering the copper material cathodic as it passes through an aqueous electrolyte containing hexavalent chromium ion-containing anions and being of sufficient alkalinity to cause precipitation of copper and chromium cations. U.S. Pat. Nos. 4,131,517 to Mitsuo et al. and 4,387,006 to Kajiwara et al. illustrate still other chromate containing treatments for suppressing time-dependent changes in color tone during storage. Still other stainproofing techniques are illustrated in U.K. published patent applications 2,030,176A and 2,073,779A.

Solutions of phosphoric acid, chromic acid, and/or their salts have also been applied to various materials in an attempt to impart tarnish and corrosion resistance to the material. U.S. Pat. Nos. 3,677,828, 3,716,427, and 3,764,400, all to Caule, illustrate the use of phosphoric acid solutions to improve the tarnish resistance of copper and copper base alloys. Caule also describes in his '400 patent the use of a caustic rinse solution after application of his phosphoric acid treatment. Phosphoric and/or chromic acid solutions have also been applied to zinc, zinc coated articles, and aluminum foil and articles. U.S. Pat. Nos. 2,030,601 to McDonald, 2,412,543 to Tanner, 2,418,608 to Thompson et al., 2,647,865 to Freud and 4,432,846 to Honeycutt III illustrate some of the applications of phosphoric-chromic acid solutions.

The treatment of copper or copper alloy foil for use in printed circuit applications creates a somewhat unique problem that limits the suitability of some stainproofing treatments. In the manufacture of printed circuits, copper sheet or foil is bonded to a dielectric substrate. Prior to bonding, at least one surface of the copper foil is generally roughened or treated to improve the bond strength between the foil and the substrate. While there are a variety of techiques available to roughen or treat the foil surface, the one most commonly used involves the formation of a plurality of copper or copper oxide dendrites on the foil surface. U.S. Pat. Nos. 4,468,293 and 4,515,671 both to Polan et al. illustrate one such dendritic roughening treatment. The primary deficiency of many stainproofing treatments is the concentration of chromic and/or phosphoric acid and/or their salts in the stainproofing solution. Where the stainproofing solution contains relatively high concentrations of chromic and/or phosphoric acid and/or their salts, immersion of the treated copper foil in the solution may lead to dissolution of the dendritic particles. This can lead to bare spots on the foil. These bare spots are potential areas for delamination between the foil and the substrate because of their relatively weak bond strength characteristics.

These stainproofing treatments have also created other problems negatively affecting the suitability of the treatment itself and/or the copper foil treated therein for use in printed circuit applications and the like. These problems include: (1) the need to electrolytically apply the stainproofing treatment causing complications in foil processing; (2) a decrease in the bond strength of the stainproofed foil; (3) an increase in the etching resistance of the foil; and (4) a decrease in the solderability of the shiny side of the foil.

In accordance with the present invention, a novel non-electrolytic stainproofing technique is provided which imparts to copper and copper alloy foil a finish having superior tarnish and oxidation resistance. This technique involves immersion of the copper or copper alloy foil in a dilute mixture of chromic acic and phosphoric acid followed by a rinse in a dilute caustic solution having a pH greater than about 8. The treatment of the present invention is particularly suited for stainproofing dendritically treated foil to be used in printed circuit applications.

The stainproofing solutions of the present invention are characterized by relatively weak concentrations of chromic and phosphoric acid—generally less than about 1 gram per liter each of phosphoric and chromic acid. By using relatively weak concentrations of these acids, the risk of dissolving the dendritic particles on the copper or copper alloy foil is greatly reduced without adversely affecting the quality of the tarnish and oxidation resistance imparted to the foil. Additionally, the treatment of the present invention does not significantly alter the peel or bond strength between the foil and typical printed circuit substrate materials and/or the circuit etchability of the resultant laminate.

It is an object of the present invention to provide a novel treatment useful in stainproofing copper and copper base alloy materials.

It is a further object of the present invention to provide a stainproofing treatment as above for treating copper or copper alloy foil and rendering it particularly suitable for use in printed circuit applications.

These and other objects and advantages of the present invention will become more apparent from the following description.

As previously noted, the present invention involves an improved non-electrolytic technique for stainproofing copper and copper alloy foil materials. As used herein, the term copper and copper alloy foil includes copper and copper base alloy sheet, strip, foil and slab materials. In accordance with the present invention, copper foil having the desired tarnish and oxidation resistance can be obtained by first immersing the copper foil in a dilute aqueous chromic acid-phosphoric acid solution and thereafter rinsing the foil in a dilute caustic solution.

The copper foil to be stainproofed may comprise any electrodeposited or wrought copper or copper alloy foil. When the foil is to be used for a printed circuit application, one surface of the foil may be treated to improve the adhesion properties of the foil. While any suitable treatment known in the art may be used to enhance the foil adhesion properties, it is preferred to electrolytically form a plurality of dendrites on the surface to be bonded to a substrate. Generally, the dendritic particles are formed in an electrolytic technique by immersing the copper or copper alloy foil in an aqueous electrolyte solution such as an aqueous sulfuric acid-copper sulfate solution and applying a cathodic current to the foil. Prior to forming the dendrites, the copper or copper alloy foil may be cleaned and/or have a copper strike layer formed thereon. The copper strike layer is applied where it is desirable to render the foil more electrochemically active and receptive to the subsequent roughening treatment. It has been discovered that by using a copper strike layer the number of unplated zones on the foil may be significantly reduced after the dendritic treatment. U.S. Pat. Nos. 4,468,293 and 4,549,950, to Polan et al., which are hereby incorporated by reference herein, illustrate suitable techniques for roughening the copper or copper alloy foil surface and preparing the copper or copper alloy foil for use in printed circuit applications.

Upon completion of the roughening treatment, the treated foil is subjected to a wash to remove any unwanted impurities, loose particles and potential solution contaminants. The wash may comprise any suitable rinse treatment known in the art. If desired, the treated foil may be dried after washing and before application of the stainproofing treatment of the present invention. Any suitable drying technique known in the art such as infra-red lamps or heated air may be used to dry the treated foil.

In accordance with the present invention, the treated copper or copper alloy foil is stainproofed by applying a dilute aqueous chromic acid—phosphoric acid stainproofing solution to the foil. As previously discussed, the use of a dilute chromic-phosphoric acid solution is preferred because the risk of dissolving the dendrites formed on the foil surface is significantly reduced. An advantage to the present treatment is that the desired tarnish and oxidation resistance may be imported to the copper or copper alloy foil without applying an electric current during stainproofing to either the foil or the stainproofing solution. Stainproofing solutions in accordance with the present invention contain chromic acid in a concentration in the range of about 0.02 grams per liter to about 1 gram per liter and phosphoric acid in a concentration in the range of about 0.02 grams per liter to about 1 gram per liter. Generally, the solutions contain no other constituents besides water and some minor impurities. Preferred embodiments of the stainproofing solution of the present invention consist essentially of from about 0.1 grams per liter to about 0.3 grams per liter of chromic acid, from about 0.1 grams per liter to about 0.3 grams per liter of phosphoric acid and the balance essentially water. The stainproofing solutions of the present invention may be prepared by mixing the ingredients in any order.

While the stainproofing treatment of the present invention may be applied in any suitable manner including brushing and spraying, it is preferred to stainproof the foil by passing an elongated sheet of the foil through a tank containing the stainproofing solution. The tank may be formed from any suitable material and may have appropriate inlet(s) and outlet(s) for adding and withdrawing the stainproofing solution. The tank may also be provided with any suitable means known in the art such as a heating/cooling loop for maintaining the stainproofing solution at a desired temperature. A plurality of rolls may be mounted to and in the tank to define a path by which the foil tracks through the tank. For example, a plurality of rolls may be arranged to enable the foil to pass through the tank in a serpentine fashion. Any suitable means known in the art may be used to mount the rolls to and in the tank. The copper or copper alloy foil to be stainproofed may be fed from a supply spool over the rolls into the stainproofing solution. Upon exiting the stainproofing treatment tank, the foil may be wound upon a suitable take-up spool.

While the stainproofing treatment of the present invention may be applied with the phosphoric-chromic acid solution at any desired temperature, it is preferred to maintain the solution in the tank at a temperature in the range of about 60° C. to about 90° C. It is also preferred to keep the foil immersed in the solution for a time in the range of about 1 second to about 120 seconds, most preferably from about 10 seconds to about 30 seconds. When other techniques such as spraying are used to apply the stainproofing solution, the foil should be exposed to the solution for similar time periods.

Upon exiting the stainproofing tank, the stainproofed foil may be dried prior to being wound on the take-up spool. Any suitable drying technique known in the art such as hot air drying or infra-red lamp drying may be used to dry the foil. If desired, brushes, squeegee rollers or air knives may be used to remove excess stainproofing solution from the foil prior to drying.

It has been found that the tarnish and oxidation resistance imparted to the foil may be improved by rinsing the stainproofed foil in a dilute caustic rinse solution immediately after the foil exits the stainproofing tank. Dilute caustic solutions in accordance with the present invention comprise aqueous solutions having a pH of at least about 8. Solutions of particular benefit are those having a pH in the range of about 9 to about 11.5. It is believed that the caustic rinse solution improves the tarnish and oxidation resistance imparted to the copper film by sealing the film deposited on the foil by the stainproofing solution. The rinse solution also serves as a means for removing unwanted chemicals, loose particles, and other impurities and contaminants from the foil exiting the stainproofing treatment tank.

Any suitable addition agent may be employed to adjust the pH of the rinse solution. Generally, the addition will be selected from the group consisting of the salts of alkali metals, the salts of the alkaline earth metals, the hydroxides of the alkali metals, and the hydroxides of the alkaline earth metals. A preferred addition agent is one selected from the group consisting of sodium hydroxide, calcium hydroxide, potassium hydroxide and ammonium hydroxide. While the amount of the addition agent present in the rinse solution will be a function of the desired pH level for the rinse solution, generally the addition agent will be present in a concentration greater than about 1 ppm.

The rinse solution may be applied to the stainproofed foil in any desired manner. For example, the rinse solution may be sprayed on the foil. Alternatively, the stainproofed foil may be passed through a tank containing the rinse solution. Additionally, the temperature of the rinse solution may be maintained at any suitable temperature. For example, the rinse solution may be kept at a temperature in the range from about room temperature to about 100° C. After the stainproofing treatment of the present invention has been completed, the treated foil may be stored or, if to be used in a printed circuit application, laminated to a suitable substrate material. The particular substrate material used in the laminate will vary depending upon the use for which the laminate is intended and the surface conditions under which such laminate will be used. Particularly appropriate substrates which adapt the laminate for use in forming printed circuits include non-flexible supports such as polytetrafluorethylene impregnated fiber glass and fiber glass impregnated by epoxy or polymers of trifluorochloroethylene. Flexible substrates include polyimides such as the polyimide resins produced by condensing a pyromellitic anhydride with an aromatic diamine. Any suitable adhesive known in the art may be used to bond the treated foil to the substrate, if needed. The stainproofing technique of the present invention does not adversely affect the laminating process nor the bond strength characteristics of the treated foil.

To demonstrate the present invention, the following example was performed:

EXAMPLE

Samples of wrought 2 oz./ft$^2$ copper alloy C11000 foil, dendritically treated in a copper sulfate-sulfuric acid solution, were immersed in an aqueous solution containing 0.2 grams per liter of chromic acid and 0.2 grams per liter of phosphoric acid for 20 seconds. The solution was at a temperature of 80° C. Other dendritically treated copper alloy C11000 foil samples were immersed in an aqueous solution containing 0.2 grams per liter of chromic acid and no phosphoric acid. After being dried with a stream of hot air, the samples were subjected to various tests.

Tarnishing tests comprising exposing the samples to heated air at 130° C. for 30 minutes and long term ambient exposure i.e., for one to six months, were conducted. Visual examination of the appearance of the samples showed the samples immersed in the chromic acid-phosphoric acid solution to be superior to samples treated in the plain chromic acid solution and to commercially available treated copper foil.

To determine if dendrites formed on the foil had been dissolved by the chromic acid-phosphoric acid stainproofing treatment, the samples were weighed before and after the stainproofing treatment. The results demonstrated that there were no weight losses during exposure to the chromic acid-phosphoric acid stainproofing solution.

Samples of the dendritically treated foil immersed in the phosphoric acid-chromic acid solution were bonded to Pyralux substrates using a standard bonding procedure. Peel strength tests were conducted on the resultant laminates in accordance with I.P.C. T.M.—650 Test Method 2.4.8. In this test, a mechanical force is applied to separate the treated foil from the substrate. The tests showed no significant change in peel strength following the stainproofing treatment.

Circuit etchability, i.e., etch rate and undercutting, was tested by etching foil samples in a standard ferric chloride etching solution. After etching, the cross sections of the samples were metallographically evaluated. The evaluations showed that the circuit etchability of the samples treated with the phosphoric acid-chromic acid solution was not adversely affectd.

While it is preferred to use a solution formed from chromic and phosphoric acids as the stainproofing solution, solutions in accordance with the present invention may be formed from salts of chromic and phosphoric acid such as sodium dichromate, lithium dichromate, sodium phosphate, potassium phosphate and lithium phosphate.

While the stainproofing treatment of the present invention has particular utility in the treatment of copper and copper alloy foil to be used in printed circuit applications, it may be used to stainproof treated or untreated copper and copper alloy materials to be used in other applications.

While the treatment of the present invention is discussed in the context of stainproofing copper and copper base alloy materials, it may also be used to impart tarnish and oxidation resistance to other metal or metal alloys such as nickel and nickel alloys.

The U.S. patent applications and foreign patent documents described in the specification are intended to be incorporated by reference herein.

It is apparent that there has been provided in accordance with this invention a copper stainproofing technique which fully satisfies the objects, means, and advantages set forth hereinbefore. While the invention has been described in combination with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

What is claimed:

1. A process for imparting tarnish and oxidation resistance to copper and copper alloy foil material, said process comprising:
    applying a dilute aqueous chromic acid-phosphoric acid solution to said material, said solution having a concentration of chromic acid in the range of about 0.02 grams per liter to about 1 gram per liter and a concentration of phosphoric acid in the range of about 0.02 grams per liter to about 1 gram per liter.

2. The process of claim 1 further comprising:
    rinsing said material after applying said solution.

3. The process of claim 2 further comprising:
    drying said material after said rinsing step.

4. The process of claim 2 wherein said rinsing step comprises:
    applying an aqueous rinse solution having a pH greater than about 8 to said material.

5. The process of claim 2 wherein said rinsing step comprises:
    applying an aqueous rinse solution having a pH in the range of about 9 to about 11.5 and a temperature in the range of about room temperature to about 100° C. to said material.

6. The process of claim 5 wherein said rinse solution contains at least about 1 ppm of a material selected from the group consisting of calcium hydroxide, sodium hydroxide, potassium hydroxide, and ammonium hydroxide.

7. The process of claim 1 wherein said applying step comprises:
    immersing said material in said dilute solution for a time in the range of about 1 second to about 120 seconds.

8. The process of claim 1 wherein said applying step comprises:
immersing said material in said dilute solution while said solution is at a temperature in the range of about 60° C. to about 90° C. for a time period in the range of about 10 seconds to about 30 seconds.

9. The process of claim 1 wherein said applying step comprises:
immersing said material in a solution containing from about 0.1 grams per liter to about 0.3 grams per liter of said chromic acid and from about 0.1 grams per liter to about 0.3 grams per liter of said phosphoric acid.

10. The process of claim 1 wherein said applying step comprises:
spraying said dilute solution onto said material.

11. The process of claim 1 further comprising:
roughening at least one surface of said material prior to said applying step, said roughening step comprising forming a plurality of dendritic particles on said at least one surface,
whereby immersion of said material in said dilute chromic acid-phosphoric acid solution does not significantly dissolve said dendritic particles.

12. A treatment for imparting improved tarnish and oxidation resistance to copper and copper alloy material, said treatment comprising a stainproofing solution containing from about 0.02 grams per liter to about 1 gram per liter of chromic acid, from about 0.02 grams per liter to about 1 gram per liter of phosphoric acid and the balance essentially water.

13. The treatment of claim 12 further comprising;
said chromic acid concentration in said solution being in the range of about 0.1 grams per liter to about 0.3 grams per liter and said phosphoric acid concentration in said solution being in the range of about 0.1 grams per liter to about 0.3 grams per liter.

14. The treatment of claim 12 further comprising:
a dilute aqueous caustic rinse solution having a pH greater than about 8, said rinse solution being applied to said material after application of said stainproofing solution.

15. The treatment of claim 14 wherein said rinse solution has a pH in the range of about 9 to about 11.5 and a temperature in the range of about room temperature to about 100° C.

16. The treatment of claim 14 wherein said rinse solution contains at least about 1 ppm of a material selected from the group consisting of calcium hydroxide, sodium hydroxide, potassium hydroxide and ammonium hydroxide.

17. A process for imparting tarnish and oxidation resistance to copper and copper alloy foil material having a plurality of dendritic particles on at least one surface, said process comprising:
applying a dilute aqueous chromic acid-phosphoric acid solution to said material having said plurality of dendritic particles, said solution having a concentration of chromic acid in the range of from about 0.02 grams per liter to about 1 gram per liter and a concentration of phosphoric acid in the range of from about 0.2 grams per liter to about 1 gram per liter,
whereby application of said dilute aqueous chromic acid-phosphoric acid solution to said material does not significantly dissolve said dendritic particles.

18. The process of claim 17 further comprising;
applying an aqueous rinse solution having a pH greater than about 8 to said material after said dilute aqueous chromic acid-phosphoric acid solution application.

19. The process of claim 17 further comprising:
rinsing said material in an aqueous rinse solution having a pH in the range of from about 9 to about 11.5 and a temperature in the range of from about room temperature to about 100° C., said solution containing at least about 1 ppm of a material selected from the group consisting of calcium hydroxide, sodium hydroxide, potassium hydroxide, and ammonium hydroxide.

20. The process of claim 17 wherein said solution applying step comprises:
immersing said material in a solution at a temperature in the range of from about 60° C. to about 90° C. for a time period in the range of about 10 seconds to about 30 seconds, said solution containing from about 0.1 grams per liter to about 0.3 grams per liter of said chromic acid and from about 0.1 grams per liter to about 0.3 grams per liter of said phosphoric acid.

* * * * *